United States Patent
Micheloni et al.

(10) Patent No.: US 6,356,481 B1
(45) Date of Patent: Mar. 12, 2002

(54) ROW DECODER FOR A NONVOLATILE MEMORY WITH CAPABILITY OF SELECTIVELY BIASING WORD LINES TO POSITIVE OR NEGATIVE VOLTAGES

(75) Inventors: Rino Micheloni, Turate; Giovanni Campardo, Bergamo, both of (IT); Atsushi Ohba, Tokyo (JP); Marcello Carrera, Trescore (IT)

(73) Assignees: STMicroelectronics S.r.l., Agrate Brianza (IT); Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 09/595,054

(22) Filed: Jun. 16, 2000

(30) Foreign Application Priority Data

Jun. 17, 1999 (EP) .............................................. 99830378

(51) Int. Cl.$^7$ ........................... G11C 16/06; G11C 16/04
(52) U.S. Cl. ............................ 365/185.23; 365/185.18; 365/185.29; 365/230.06
(58) Field of Search ........................ 365/185.23, 185.28, 365/185.22, 185.29, 189.09, 230.06, 185.18

(56) References Cited

U.S. PATENT DOCUMENTS

| | | | |
|---|---|---|---|
| 5,384,742 A | 1/1995 | Miyakawa et al. | ......... 365/218 |
| 5,455,789 A * | 10/1995 | Nakamura et al. | ...... 365/185.17 |
| 6,147,909 A * | 11/2000 | Fujio | ..................... 365/185.23 |
| 6,166,957 A * | 12/2000 | Chung et al. | .......... 365/185.23 |

FOREIGN PATENT DOCUMENTS

WO          WO 96/23307          8/1996

* cited by examiner

Primary Examiner—Son Mai
(74) Attorney, Agent, or Firm—Lisa K. Jorgenson; David V. Carlson; SEED IP Law Group PLLC

(57) ABSTRACT

The row decoder includes, for each word line of the memory, a respective biasing circuit receiving at the input a row selection signal switching, in preset operating conditions, between a supply voltage and a ground voltage and supplying at the output a biasing signal for the respective word line switching between a first operating voltage, in turn switching at least between the supply voltage and a programming voltage higher than the supply voltage, and a second operating voltage, in turn switching at least between the ground voltage and an erase voltage lower than the ground voltage. Each biasing circuit includes a level translator circuit receiving at the input the row selection signal and supplying as output a control signal switching between the first and the second operating voltages and an output driver circuit receiving as input the control signal and supplying at the output the biasing signal.

26 Claims, 2 Drawing Sheets

ROW DECODER FOR A NONVOLATILE MEMORY WITH CAPABILITY OF SELECTIVELY BIASING WORD LINES TO POSITIVE OR NEGATIVE VOLTAGES

TECHNICAL FIELD

The present invention regards a row decoder for a nonvolatile memory with possibility of selectively biasing the word lines with positive or negative voltages.

BACKGROUND OF THE INVENTION

As is known, nonvolatile memories comprise an array of cells arranged on rows and columns wherein word lines connect the gate terminals of the cells arranged on a same row, and bit lines connect the drain terminals of the cells arranged on a same column. Individual rows of the memory array are then addressed by a row decoder receiving at the input a coded address.

It is further known that, in a nonvolatile memory cell of the floating gate type, storage of a logic state is carried out by programming the threshold voltage of the memory cell so as to define the amount of electric charge stored in the floating gate region.

According to the stored information, memory cells may be distinguished into erased memory cells (stored logic state "1"), wherein no electric charge is stored in the floating gate region, and written or programmed memory cells (stored logic state "0"), wherein the electric charge stored in the floating gate region is sufficient to determine a sensible increase in the threshold voltage of the memory cells.

Erasing a nonvolatile memory is a highly complex operation, in that it entails a number of settings to be performed prior to proper erasing, when the electric charges present in the floating gate region is extracted and as a result the threshold voltage of the memory cells is reduced, and then entails verify operations and possibly further modifications after erasing when the result of erasing is not fully satisfactory.

In particular, to erase a sector, first of all a pre-conditioning operation is carried out, i.e., all the memory cells are brought to the programmed state regardless of their current state. Indeed, if a sector were erased wherein some of the memory cells are written but others have already been erased, during erasing there would be an over-erasing of the memory cells that have already been erased, so that these memory cells are very likely to become depleted, i.e., they have negative threshold voltage, and hence drain current even when their gate terminals are grounded. This effect proves particularly troublesome in that it simulates the constant presence of erased memory cells in the columns to which they belong, and thus all the memory cells belonging to these columns are read as being erased irrespective of their actual state.

In order to prevent this phenomenon and to render the history of all the memory cells belonging to the same sector uniform, writing of the entire sector is carried out.

Following upon the operation of pre-conditioning, all the memory cells of the sector are thus programmed and have threshold voltages with the distribution illustrated in FIG. 1 and identified with the binary information "0" associated to this distribution. For this distribution, FIG. 1 also shows the typical minimum values for the threshold voltages.

Next proper erasing is carried out. In this phase, for a so called "negative gate" erasing, the drain and source terminals of the memory cells are appropriately biased in a per se known manner, and hence not described in detail, and an erase pulse typically having a duration of the order of 10 msec is applied on the gate terminals. Upon termination of the erase pulse, a verify operation is carried out on all the memory cells of the sector to check the value of their threshold voltages, and this verify operation is carried out by performing a marginal reading that will guarantee proper recognition of the memory cell in the normal read modality.

For this reason, erasing proceeds with applying an erase pulse followed by a verify operation until all the memory cells present a threshold voltage lower than a reference threshold voltage, the latter being the threshold voltage of the reference memory cell used during the verify operation.

At this point, all the memory cells of the sector have threshold voltages presenting the distribution illustrated in FIG. 1 and identified by the binary information "1" associated thereto, i.e., a distribution having a basically Gaussian form, in which the threshold voltage used during the verify operations referred to above is indicated by EV and is typically 2.5 V.

As may be noted from an analysis of FIG. 1, the distribution of the threshold voltages that is obtained after erasing has a form given by the superposition of a Gaussian curve and a tail due to the depleted memory cells.

Sector erasing cannot, however, be considered as yet concluded, because it is still necessary to ascertain whether there are depleted memory cells that may induce errors during reading.

Consequently, proper erasing is followed by a search phase for depleted memory cells, known as "soft-programming", including verifying the presence of a leakage current on the columns of the memory array, with all the rows of the array kept grounded.

When a column that presents this fault is identified, the first memory cell of the column is addressed, and a programming pulse having a preset amplitude is applied to the gate terminal to slightly shift the threshold of the memory cell, without, however, exceeding the EV value mentioned above. Next, reading of the second memory cell in the same column is carried out. If the memory cell has no leakage current, this means that the depleted memory cell was the previous one which has already been recovered; otherwise, programming of the memory cell in question is carried out, and so forth until the end of the column is reached.

Once the end of the column has been reached, verify is then repeated and, if there is still a leakage current present, the above described procedure is repeated, this time, however, increasing the amplitude of the programming pulse applied to the gate terminal of the memory cells during programming.

As may be noted from the above description, searching for depleted memory cells is particularly laborious and requires not only a non-negligible execution time, but also the supply of a considerable current when programming the depleted memory cells.

This latter aspect is of particular importance in memory devices with single supply voltage. In this case, in fact, all the necessary high voltages are obtained from the single supply voltage available through charge pumps, which present, however, a very limited current capacity, typically of just a few mA, and thus allowing only a small number of columns containing depleted memory cells to be simultaneously recovered.

A further drawback involved in the procedure of searching for depleted memory cells as described above is due to the fact that the illustrated problems, which are linked to the presence of a depleted memory cell in one column (simulation of the presence of an entirely erased column when in actual fact there are still memory cells having threshold voltages higher than EV) becomes particularly important and may even lead to jeopardizing the functioning of the memory in case of multilevel memory cells, i.e., memory cells that are each able to store more than one bit.

In fact, considering for example memory cells each containing two bits, the number of distributions of the threshold voltages is four, one for each combination of the logic levels of the pair of bits stored in a cell, instead of two as in case of conventional memory cells storing a single bit.

FIG. 2 illustrates the distributions of the threshold voltages deriving from the use of four level memory cells, i.e., cells storing two bits. For each distribution, the maximum and minimum values typical of the threshold voltages and the binary information associated thereto are indicated.

As may be noted from a comparison between FIG. 2 and FIG. 1, the latter regarding distributions resulting from the use of conventional two level memory cells, i.e., ones storing a single bit, the four distributions resulting from the use of multilevel memory cells fall within the same range of threshold voltage values in which the two distributions resulting from the use of conventional memory cells also fall, in that, for reasons of reliability it is not desirable to increase the voltage too much, and this consequently leads to a reduction in the distance between two adjacent distributions, and hence a reduction in the difference between the currents which flow in the memory cells and which correspond to adjacent levels.

Consequently, the introduction on the market of multilevel memory cells means that the margins of the distributions must be checked in an even more accurate way than with conventional memory cells, in so far as a multilevel memory cell which exceeds the threshold voltage EV (2.5 V) even by just a little could in fact be erroneously interpreted as belonging to the second distribution instead of to the first, thus possibly impairing the functioning of the memory.

One solution for considerably simplifying the search for depleted memory cells, directly identifying the depleted memory cells and reducing to the minimum all the above described problems, is that of biasing non-selected memory cells with negative voltages during verify. In this way, then, the leakage current during verify would be eliminated.

Such a solution is not, however, feasible using the row decoders known today. For a complete understanding of the limits of the currently known row decoders, which do not enable the use of such a solution, refer to FIG. 3, where the classic circuit diagram of a final decoding stage forming part of a row decoder (not illustrated) for a nonvolatile memory is illustrated.

In particular, the circuit diagram illustrated in FIG. 3 regards a final decoding stage used in a memory device allowing so-called "negative gate erasing", which envisages the application of a negative voltage to the gate terminals of the cells and of a positive voltage to the source terminals, with floating drain terminals.

As is shown in FIG. 3, the final decoding stage, indicated as a whole by 1, receives at the input a plurality of pre-decoding signals Lx, Ly, Lz, P, generated by a pre-decoding stage (not illustrated), which also is part of the row decoder arranged upstream of the final decoding stage and generating the above decoding signals according to the addresses of the memory location to be addressed. The final decoding stage 1 has the purpose of biasing a word line of the memory array 2 made up of a plurality of cells 3, arranged in rows and columns, wherein the word lines (only two of which, for reasons of simplicity of illustration are shown in FIG. 3, indicated by WL<i> and WL<i+1>) connect the gate terminals of the memory cells 3 arranged on a same row, and the bit lines (not illustrated) connect the drain terminals of the memory cells 3 arranged on a same column.

In particular, the pre-decoding signals Lx, Ly and Lz are used to select the group of word lines, typically 8 or 16, biased through the final decoding stage 1, while the pre-decoding signals P are used to select a single word line within the group.

The final decoding stage 1 comprises a first supply line 4 set at a voltage $V_{PC}$, which during cell addressing is equal to a supply voltage $V_{CC}$ (typically, of between 2.5 and 3.5 V), and during cell programming is equal to the programming voltage $V_{PP}$ higher than the supply voltage $V_{CC}$ (for example, 12 V); and a second supply line 5 set at a voltage $V_{NEG}$, which, during reading and programming of the memory cells, is equal to a ground voltage $V_{GND}$ (for example, 0 V), and during memory cell erasing is equal to an erase voltage $V_{ERN}$ lower than ground voltage $V_{GND}$ (for example, −8 V).

The final decoding stage 1 further comprises an input selection circuit 6 formed by a NAND logic gate receiving as input the pre-decoding signals Lx, Ly, Lz and supplying as output a block selection signal SB; a plurality of output driver circuits 8 of the latch type, one for each word line addressable through the final decoding stage 1, which generate at the output biasing signals R<i>, R<i+1> for respective word lines WL<i>, WL<i+1>; and a plurality of switching circuits 10, one for each word line addressable through the final decoding stage 1, each of which circuits is arranged between the output of the selection circuit 6 and the input of a respective driver circuit 8, receives at the input a respective pre-decoding signal P<i>, P<i+1>, and has the purpose of selectively interrupting the connection between the selection circuit 6 and the respective driver circuit 8 according to the respective pre-decoding signal P<i>, P<i+1>.

The pre-decoding signals Lx, Ly, Lz, and P, as well as the block selection signal SB are logic signals having a low logic state defined by the ground voltage $V_{GND}$ and a high logic state defined by the supply voltage $V_{CC}$.

Each driver circuit 8 comprises an inverter 12 comprising a pull-up PMOS transistor 14 and a pull-down NMOS transistor 16 having gate terminals connected together and defining an input node 18, drain terminals connected together and defining an output node 20 on which the respective biasing signal R<i>, R<i+1> is present, and source and bulk terminals connected to the first and, respectively, the second supply lines 4, 5.

Each driver circuit 8 further comprises a feedback PMOS transistor 28 having its gate terminal connected to the output node 20, its drain terminal connected to the input node 18, and its source and bulk terminals connected to the first supply line 4.

The NMOS transistors 16 have a triple-well type structure, as shown in FIG. 4; i.e., they present a bulk region made in a P-type well 22 set at the voltage $V_{NEG}$ and formed in an N-type well 24 set at the supply voltage $V_{CC}$ and in turn formed in a substrate 26 which is set at the ground voltage $V_{GND}$. In this way, the P-type well 22 is electrically isolated from the substrate 26 and thus enables biasing of the bulk regions of the transistors 16 at a potential, in the case in point $V_{NEG}$, different from the potential of the substrate 26 (ground voltage $V_{GND}$).

Each switching circuit 10 comprises a first NMOS pass transistor 30 and a second NMOS pass transistor 32 arranged in series and coupled between the output terminal of the NAND logic gate and the input node 18 of the respective driver circuit 8. In particular, the NMOS transistor 30 has its drain terminal connected to the output terminal of the NAND logic gate, its gate terminal set at the supply voltage $V_{CC}$, and its source terminal connected to the drain terminal of the NMOS transistor 32, which in turn has its gate terminal receiving the respective pre-decoding signal P<i>, P<i+1>, and its source terminal connected to the output node 18.

Negative gate erasing is an intrinsically non-selective operation and is carried out in a known way, and thus not described in detail herein, first of all biasing the second supply line 5 at the erase voltage $V_{ERN}$ and then deselecting all the word lines WL<i>, WL<i+1>. In this way, the input nodes 18 are set at a high logic level, and hence the NMOS transistors 16 are on, thus connecting the output nodes 20 to the second supply line 5, and consequently determining application of the erase voltage $V_{ERN}$ to the word lines WL<i>, WL<i+1>.

To search for depleted memory cells in the way described previously, it is necessary to selectively bias the word lines, and in particular it is necessary to apply a positive verify voltage to a single word line at a time, and a negative voltage to all the other word lines.

A selective biasing of this sort is not, however, possible with the final decoding stage described above. In fact if the attempt were made to apply a positive voltage to one word line and a negative voltage to all the other word lines, the input nodes 18 of the biasing circuits 8 of the non-selected word lines, and hence the gate terminals of the NMOS transistors 16, would all be set at the voltage $V_{PC}$, whilst the source terminals of these transistors would be set at the erase voltage $V_{ERN}$. Consequently, the corresponding NMOS transistors 16 would all be turned on and would connect the respective word lines to the second supply line 5 set at the erase voltage $V_{ERN}$.

On the other hand, the input node 18 of the driver circuit 8 of the selected word line, and hence the gate terminal of the respective NMOS transistor 16, would be set at the ground voltage $V_{GND}$ defined by the low logic level assumed by the block selection signal SB, while the source terminal of this NMOS transistor 16 would be set at the erase voltage $V_{ERN}$ lower than the ground voltage $V_{GND}$. Consequently, the PMOS transistor 14 would be on, while the NMOS transistor 16 would be off.

If, however, the difference between the ground voltage $V_{GND}$ and the erase voltage $V_{ERN}$ is higher than the threshold voltage of the NMOS transistor 16, also this transistor will be on and, jointly with the PMOS transistor 14, which is on, will connect together the first and the second supply lines 4, 5, thus preventing proper biasing of the respective word line, and consequently jeopardizing the reliability of searching for depleted memory cells.

A solution for overcoming the above described problem without modifying the circuit structure of the final decoding stage includes using NMOS transistors 16 having a threshold voltage higher than the difference between the ground voltage $V_{GND}$ and the erase voltage $V_{ERN}$.

If not directly available with such characteristics, transistors of the sort could be obtained by suitably biasing the bulk regions 22 so as to increase the threshold voltage of these transistors, exploiting the well known body effect.

Even if this solution presents a greater circuit simplicity because the circuit structure of the final decoding stage does not need to be modified, it entails a greater complexity for managing the various voltages necessary during word line decoding. Biasing a substrate means, in fact, charging and discharging large parasitic capacitances, and, in addition, the times for charging and discharging must be well controlled in order to prevent direct biasing of the junctions. Furthermore, a solution of this type imposes a limit on the erase voltage $V_{ERN}$ used during verify.

SUMMARY OF THE INVENTION

The purpose of the present invention is therefore that of providing a word line decoder that enables selective biasing of the word lines with positive or negative voltages.

According to the present invention, a word line decoder for a nonvolatile memory with the possibility of selectively biasing the word lines with positive or negative voltages is provided.

BRIEF DESCRIPTION OF THE DRAWINGS

For a better understanding of the present invention, a preferred embodiment thereof is now described, purely as a non-limiting example, with reference to the attached drawings, wherein.

DETAILED DESCRIPTION OF THE INVENTION

Figure 5:
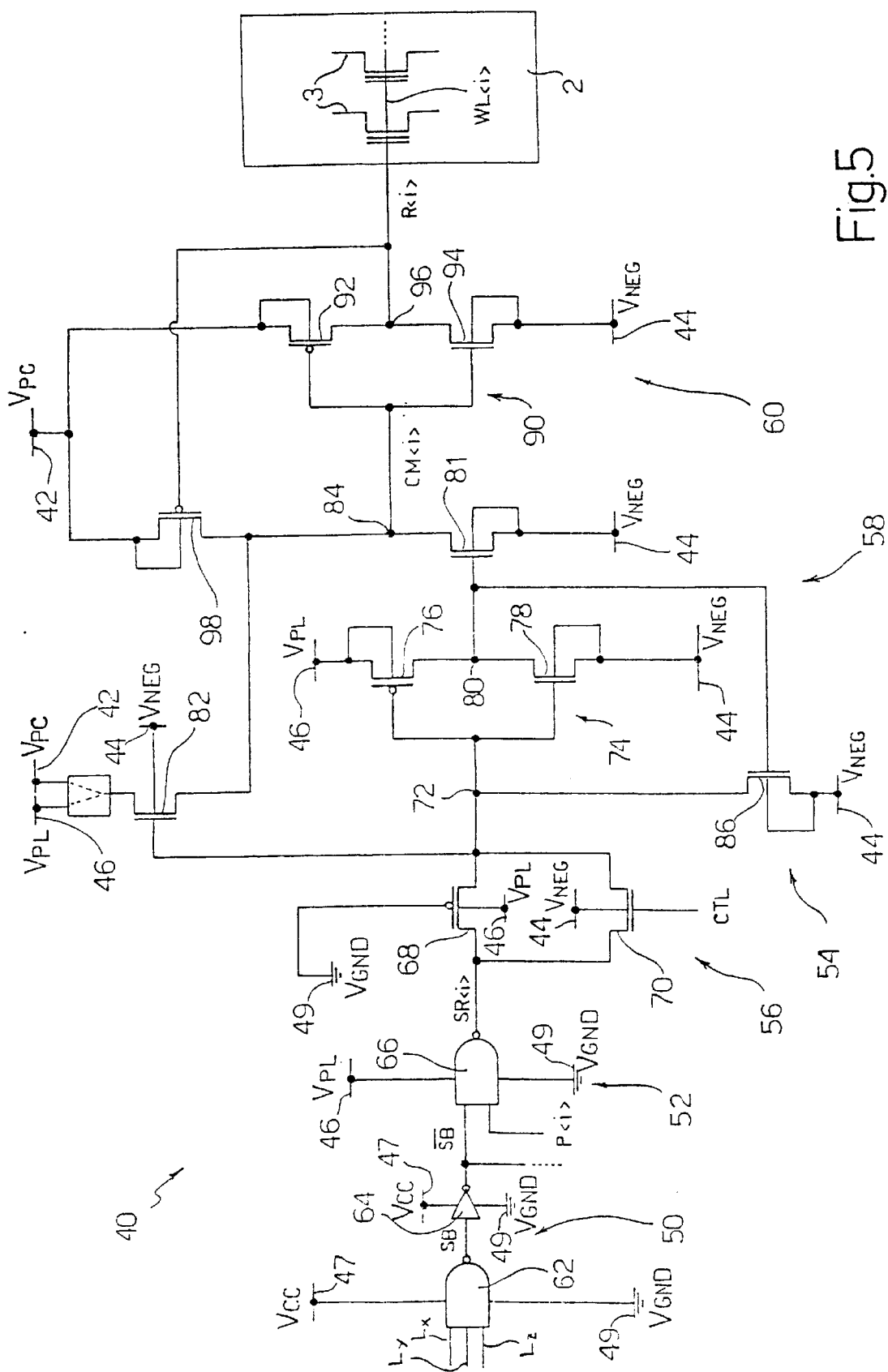
FIG. 5 shows the circuit diagram of a final decoding stage, according to the present invention.

In FIG. 5, indicated as a whole by the reference number 40, is a final decoding stage according to the present invention for biasing a respective block of word lines of the memory 2, only one of, which, for reasons of simplicity, is illustrated in FIG. 5 and indicated WL<i>.

According to FIG. 5, the final decoding stage 40 comprises a first supply line 42 set at the voltage $V_{PC}$ switchable between the supply voltage $V_{CC}$, the programming voltage $V_{PP}$, and a reduced voltage $V_{PX}$ lower than the supply voltage $V_{CC}$ (for example, 2 V); a second supply line 44 set at the voltage $V_{NEG}$ switchable between the ground voltage $V_{GND}$, the erase voltage $V_{ERN}$, and a verify voltage $V_{VER}$ comprised between the ground voltage $V_{GND}$ and the erase voltage $V_{ERN}$ (for example −2 V); a third supply line 46 set at a voltage $V_{PL}$ which is equal to the supply voltage $V_{CC}$ when $V_{PC} \geq V_{CC}$, and to the reduced voltage $V_{PX}$ when $V_{PC} < V_{CC}$; a fourth supply line 47 set at the supply voltage $V_{CC}$; and a fifth supply line 49 set at the ground voltage $V_{GND}$.

Figure 1:
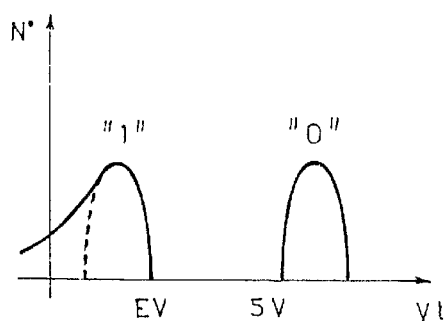
FIG. 1 shows the distributions of the threshold voltages of memory cells containing a single bit per cell.
Figure 2:
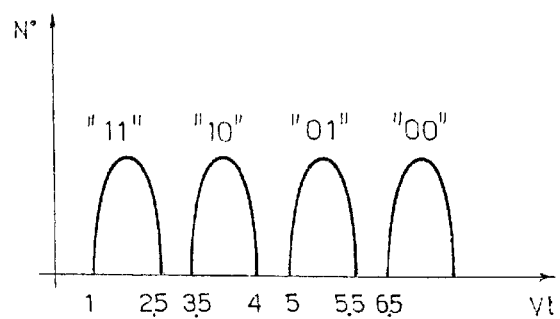
FIG. 2 shows the distributions of the threshold voltages of memory cells containing two bits per cell.
Figure 3:
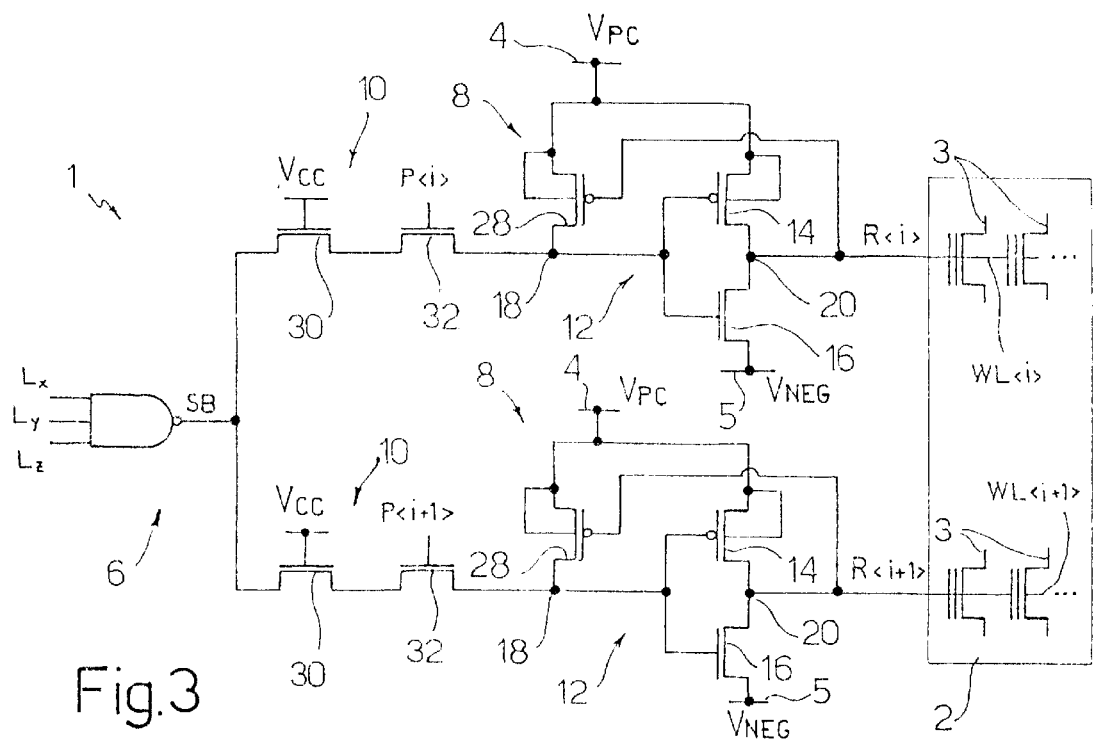
FIG. 3 shows the circuit diagram of a final decoding stage forming part of a known row decoder.

Circuits for the generation of reference voltages at selected levels are known in the art. Any acceptable voltage generator circuit that produces the various reference voltages, such as, $V_{PP}$, $V_{CC}$, $V_{PX}$, $V_{GND}$, $V_{VER}$ and $V_{ERN}$ may be used. It is also known how to connect such to the reference lines $V_{PC}$ and $V_{NEG}$ using the same techniques used in the prior art, for example as used in FIG. 2.

The final decoding stage 40 further comprises a block selection circuit 50, arranged at the input and common to a plurality of word lines, and, for each word line, a row selection circuit 52 and a row biasing circuit 54 cascade-connected. For simplicity, FIG. 5 shows the row selection circuit 52 and the row biasing circuit 54 for the single word line WL<i> considered.

Each row biasing circuit 54 in turn comprises a switching circuit 56, a level translator circuit 58, and an output driver circuit 60, cascade-connected.

In particular, the block selection circuit 50 comprises a NAND logic gate 62 connected between the fourth and the fifth supply lines 47 and 49, receiving at its input terminals the pre-decoding signals Lx, Ly, Lz and supplying at an output terminal a block selection signal SB; and a NOT logic gate 64 connected between the fourth and the fifth supply lines 47 and 49 receiving at an input terminal a block selection signal SB and supplying at an output terminal an inverted block selection signal $\overline{SB}$.

The row selection circuit 54 comprises a NAND logic gate 66 connected between the third and the fifth supply lines 46 and 49, receiving at a first input the inverted block selection signal $\overline{SB}$ and at a second input the pre-decoding signal P<i>, and supplying at its output terminal a row selection signal SR<i>.

The pre-decoding signals Lx, Ly, Lz, and P, as well as the block selection signal SB and the inverted block selection signal $\overline{SB}$ are logic signals having a low logic state defined by the ground voltage $V_{GND}$ and a high logic state defined by the supply voltage $V_{CC}$, while the row selection signal SR<i> is a logic signal having a low logic state defined by the ground voltage $V_{GND}$ and a high logic state defined by the voltage $V_{PL}$.

The switching circuit 56 comprises a CMOS switch formed by a PMOS transistor 68 and an NMOS transistor 70 having drain terminals connected together and to the output terminal of the NAND logic gate 66 and receiving the row selection signal SR<i>, and source terminals connected together and to a node 72; the PMOS transistor 68 moreover has its gate terminal connected to the fifth supply line 49 and its bulk terminal connected to the third supply line 46, while the NMOS transistor 70 has its gate terminal receiving a control signal CTL and its bulk terminal connected to the second supply line 44 set at the voltage $V_{NEG}$.

The level translator circuit 58 comprises an inverter 74 formed by a pull-up PMOS transistor 76 and a pull-down NMOS transistor 78 having their gate terminals connected together and to the node 72 and their drain terminals connected together and defining a node 80; the PMOS transistor 76 moreover has its source terminal and its bulk terminal connected to the third supply line 46; the NMOS transistor 78 has its source terminal and its bulk terminal connected to the second supply line 44.

The level translator 58 further comprises an NMOS transistor 81 having its gate terminal connected to the node 80, its drain terminal connected to a node 84, and its source terminal connected to the second supply line 44; an NMOS transistor 82 having its gate terminal connected to the node 72, its drain terminal connected to the first supply line 42 or to the third supply line 46, as represented schematically in FIG. 5 with a dashed line, its source terminal connected to the node 84, and its bulk terminal connected to the second supply line 44; and an NMOS transistor 86 having its gate terminal connected to the node 80, its drain terminal connected to the node 72, and its source and bulk terminals connected to the second supply line 44.

In particular, the drain terminal of the NMOS transistor 82 is irreversibly connected to the first supply line 42 or to the third supply line 46, according to the particular application of the memory device provided with final decoding stage 40, for example for current consumption, and this choice is made once and for all when designing the memory device.

The driver circuit 60 comprises an inverter 90 formed by a pull-up PMOS transistor 92 and a pull-down NMOS transistor 94 having their gate terminals connected together and to the node 84, their drain terminals connected together and defining a node 96 on which the biasing signal R<i> is supplied, and their source and bulk terminals connected, respectively, to the first supply line 42 and to the second supply line 44.

The driver circuit 60 further comprises a feedback PMOS transistor 98 having its gate terminal connected to the node 96, its drain terminal connected to the node 84, and its source and bulk terminals connected to the first supply line 42.

Figure 4:
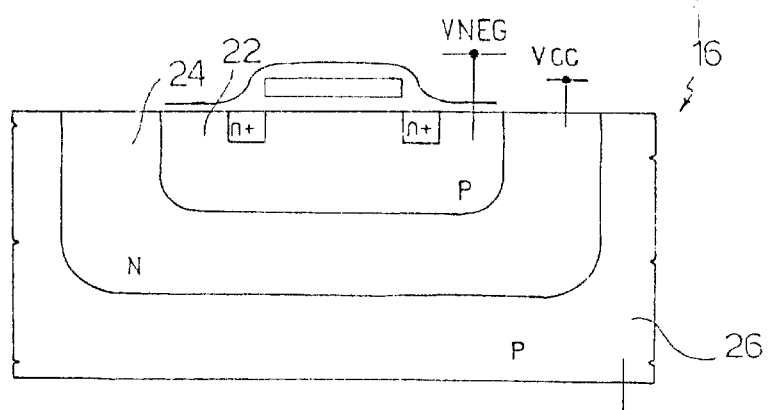
FIG. 4 shows a cross section of the structure of a triple-well transistor.

The NMOS transistors 70, 78, 81, 82, 86, and 94 have a triple-well structure, illustrated in FIG. 4 and previously described.

The operation of the final decoding stage 40 will now be described for the programming and reading step, when the selected word line is biased at the voltage $V_{PC}$, and the deselected word lines are biased at the ground voltage $V_{GND}$, for the erasing step, wherein all the word lines are deselected and they are biased at the erase voltage $V_{ERN}$, and for the verify step, wherein which the selected word line is biased at the voltage $V_{PC}$, and the deselected word lines are biased at the verify voltage $V_{VER}$.

In particular, during reading and programming, the first supply line 42 is set, respectively, at the supply voltage $V_{CC}$ and at the programming voltage $V_{PP}$. The second upply line 44 is set at the ground voltage $V_{GND}$, and the third supply line 46 is set at the supply voltage $V_{CC}$.

In addition, the control signal CTL assumes a high logic level defined by the supply voltage $V_{CC}$, and therefore both the PMOS transistor 68 and the NMOS transistor 70 are on.

When the word line WL<i> is selected, the row selection signal SR<i> assumes a low logic level defined by the ground voltage $V_{GND}$ which, via the PMOS transistor 68 and the NMOS transistor 70, biases the node 72 at the ground voltage $V_{GND}$.

Consequently, the NMOS transistor 78 is off, the PMOS transistor 76 is on, and hence the node 80 is biased at the supply voltage $V_{CC}$, thus causing the NMOS transistor 81 to turn on.

The node 84 is therefore biased at the ground voltage $V_{GND}$, and hence the NMOS transistor 82 is off, the NMOS transistor 94 is off, and the PMOS transistor 92 is on; consequently, the word line WL<i> is biased at the voltage $V_{PC}$.

The node 80 set at the supply voltage $V_{CC}$ also causes the NMOS transistor 86 to turn on, which simply confirms the ground voltage $V_{GND}$ on the node 72.

When, instead, of the word line WL<i> is deselected, the row selection signal SR<i> assumes a high logic level equal to the supply voltage $V_{CC}$, and the node 72 is biased at the supply voltage $V_{CC}$ and the node 80 at the ground voltage $V_{GND}$.

Consequently, the NMOS transistors 86 and 81 are off, the NMOS transistor 82 is on and pushes the node 84 to rise towards the voltage $V_{PC}$; as a result, the PMOS transistor 92 turns off, and the NMOS transistor 94 turns on, and the word line WL<i> is thus biased at the ground voltage $V_{GND}$.

During erasing, the first supply line 42 is set at the reduced voltage $V_{PX}$, the second supply line 44 is set at the erase voltage $V_{ERN}$, and the third supply line 46 is set at the reduced voltage $V_{PX}$ to reduce the stress on the oxide layers of the transistors.

Furthermore, the control signal CTL assumes a low logic level defined by he erase voltage $V_{ERN}$, thus the NMOS transistor 70 is off since its gate terminal is set at he lowest voltage present in the circuit.

During this phase, moreover, all the word lines are deselected, and consequently all the block selection signals SB present on the output terminals of the NAND logic gates 62 assume a high logic level defined by the supply voltage $V_{CC}$.

Consequently, via the PMOS transistor 68, the node 72 is biased at the reduced voltage $V_{PX}$, the NMOS transistors 78 and 82 are on, while the PMOS transistor 76 is off.

The node 80 is therefore biased at the erase voltage $V_{ERN}$ and causes the NMOS transistors 86 and 81 to turn off; the node 84 is thus free to rise to the voltage $V_{PX}$, so causing the NMOS transistor 94 to turn on; all the word lines are therefore biased at the erase voltage $V_{ERN}$.

During the verify phase, the first and third supply lines are set at the supply voltage $V_{CC}$, and the second supply line 44 is set at the verify voltage $V_{VER}$. In addition, the control signal CTL assumes a low logic level defined by the verify voltage $V_{VER}$ itself, and consequently during this phase the NMOS transistor 70 is off.

When the word line WL<i> is selected, the row selection signal SR<i> assumes a low logic level defined by the ground voltage $V_{GND}$, and hence, via the PMOS transistor 68, the node 72 is discharged as long as the gate-to-source voltage of the PMOS transistor 68 is greater than its threshold voltage, after which the PMOS transistor 68 turns off and stops discharging the node 72.

The node 72 thus moves toward the verify voltage $V_{VER}$, so causing the PMOS transistor 76 to turn on and the NMOS transistors 78 and 82 to turn off; the node 80 thus moves toward the supply voltage $V_{CC}$, thus causing the NMOS transistors 86 and 81 to turn on. The node 72 is thus connected to the second supply line 44, and hence biased at the verify voltage $V_{VER}$, and so causes the NMOS transistor 78 to turn off definitively.

Since the NMOS transistor 81 is turned on, the node 84 is forced to assume the verify voltage $V_{VER}$, and hence the NMOS transistor 94 is off, the PMOS transistor 92 is on, and the selected word line is thus biased at the voltage $V_{PC}$.

When the word line WL<i> is deselected, the row selection signal SR<i> assumes a high logic level equal to the supply voltage $V_{CC}$, and hence also the node 72 is biased at the supply voltage $V_{CC}$. Consequently, the PMOS transistors 78 and 82 are on, the PMOS transistor 76 is off, and therefore the node 80 is biased at the verify voltage $V_{VER}$ and causes the NMOS transistors 86 and 81 to turn off. The node 84 thus reaches the voltage $V_{PC}$ and causes the NMOS transistor 94 to turn on and the PMOS transistor 92 to turn off; as a result, the deselected word line is biased at the verify voltage $V_{VER}$.

As may be noted from the above description, the introduction, between the switching circuit 56 and the driver circuit 60, of the voltage translator circuit 58, built as described and connected to the second supply line 44 set at the voltage $V_{NEG}$, prevents the malfunctioning which was described previously in detail with reference to the known row decoders and on account of which the known row decoders cannot enable biasing, during verify, of the selected word line at a positive voltage and of the deselected word lines at negative voltages.

In fact, the voltage translator circuit 58 converts the row selection signal SR<i>, having a high and a low logic state defined, respectively, by the supply voltage $V_{CC}$ and the ground voltage $V_{GND}$, into a control signal CM<i> defined by the voltage of the node 84 which has a high and a low logic state defined, respectively, by the voltage $V_{PC}$ and the voltage $V_{NEG}$ at which the source terminal of the NMOS transistor 94 is also set. This latter aspect is particularly important in that, when the control signal CM<i> is supplied to the input of the driver circuit 60, in the verify phase both the gate terminal and the source terminal of the NMOS transistor 94 of the driver circuit 60 of the selected word line are set at the same verify voltage $V_{VER}$, and hence the NMOS transistor 94 itself is certainly off when the PMOS transistor 92 is on.

As a result, the final decoding stage 40 according to the present invention is free from the limitations inherent in the known final decoding stages in so far as it enables selective biasing of the word lines of a memory indifferently with positive or negative voltages and, in particular, enables biasing of the selected word line alone with a positive voltage and of all the other deselected word lines with negative voltages.

In this way, it is possible not only to considerably simplify searching for the depleted memory cells, but also to sensibly reduce the time required for carrying out the soft-program algorithm and the current required during programming of the depleted memory cells.

In addition, as emerges from the above description, theoretically there are no limits on the maximum values of the erase and verify voltages $V_{ERN}$, $V_{VER}$, except for those imposed by the breakdown voltages.

Furthermore, it emerges clearly that, since the final decoding stage according to the present invention can bias a bit line in a selective manner indifferently at a positive voltage or a negative voltage, it is also immediately possible to carry out erasing even of a single row of the memory array at a time. To do so, it is in fact sufficient to complement the addressing logic so as to be able to bias one word line at a time with a negative voltage and all the other word lines with positive voltages.

It is moreover pointed out that the NMOS transistor 70 is not strictly necessary, in so far as it has been introduced purely to speed up the addressing operation during the read phase. Without the NMOS transistor 70, in fact, the lowest voltage that can be transferred onto the node 72 is equal to the threshold voltage of the PMOS transistor 68. Also in this condition, the final decoding stage continues to function as above described, provided that the threshold voltage of the PMOS transistor 68 is interpreted as a low logic level by the inverter 74. The NMOS transistor 70 improves the immunity to noise and speeds up discharging of the node 72 during writing.

Finally, it is clear that modifications and variations may be made to the row decoder described and illustrated herein, without thereby departing from the scope of the present invention.

For example, the voltage of the third supply line 46 could also not be switchable between the supply voltage $V_{CC}$ and the reduced voltage $V_{PX}$, but could be set in a fixed way at the supply voltage $V_{CC}$.

What is claimed is:

1. A row decoder for a nonvolatile memory comprised of a plurality of word lines, said row decoder comprising a first reference line set at a first operating potential switchable at least between a first reference potential and a programming potential higher than said first reference potential, a second reference line set at a second operating potential switchable at least between a second reference potential lower than said first reference potential and an erase potential lower than said second reference potential, and a third reference line set at a third operating potential equal, at least in preset operating conditions, to said first reference potential, and, for each one of said word lines, a respective biasing circuit receiving on an input a row selection signal switchable between said third operating potential and said second reference potential and supplying at an output a biasing signal for the respective word line switchable between said first and said second operating potentials; each said biasing circuit comprising an output driver circuit connected between said first and said second reference lines and supplying on an output said biasing signal, wherein each said biasing circuit further comprises a level translator circuit connected between said second and said third reference lines, receiving on an input said row selection signal and supplying on an output a control signal for said driver circuit switchable between said first and said second operating potentials.

2. The row decoder according to claim 1, wherein said level translator circuit comprises a first inverter connected between said second and said third reference lines and receiving at an input said row selection signal; a first transistor having a control terminal connected to an output of said first inverter, a first terminal connected to said output of said level translator circuit, and a second terminal connected to said second reference line; and a second transistor having a control terminal connected to said output of said first inverter, a first terminal connected to said input of said first inverter, and a second terminal connected to said second reference line.

3. The row decoder according to claim 2, wherein said level translator circuit further comprises a third transistor having a control terminal connected to said input of said first inverter, a first terminal connected to one of said first and said third reference lines and a second terminal connected to said output of said level translator circuit.

4. The row decoder according to claim 3, wherein said first, second and third transistors have a triple-well type structure.

5. The row decoder according to claim 2, wherein said first inverter comprises fourth and fifth transistors complementary to one another and having respective control terminals connected together and to said input of said first inverter, first terminals connected together and to said output of said first inverter and second terminals connected, respectively, to said third reference line and said second reference line.

6. The row decoder according to claim 5, wherein said fifth transistor has a triple-well type structure.

7. The row decoder according to claim 1, wherein said driver circuit comprises a second inverter connected between said first and second reference lines and having an input connected to said output of said level translator circuit and an output supplying said biasing signal.

8. The row decoder according to claim 7, wherein said second inverter comprises a sixth and seventh transistors complementary to one another and having respective control terminals connected together and to said output of said level translator circuit, first terminals connected together and to said output of said driver circuit, and second terminals connected, respectively, to said first reference line and said second reference line.

9. The row decoder according to claim 8, wherein said seventh transistor has a triple-well type structure.

10. The row decoder according to claim 7, wherein said driver circuit further comprises an eighth transistor having a control terminal connected to said output of said second inverter, a first terminal connected to said input of said second inverter, and a second terminal connected to said first reference line.

11. The row decoder according to claim 1, wherein said biasing circuit further comprises a switching circuit arranged upstream of said level translator circuit and comprising unipolar switching means.

12. The row decoder according to claim 11, wherein said unipolar switching means comprises a ninth transistor, of PMOS type, having a control terminal set at said second reference potential, a first terminal receiving said row selection signal, and a second terminal connected to said input of said level translator circuit.

13. The row decoder according to claim 12 wherein said switching circuit further comprises a tenth transistor, of NMOS type, having a control terminal receiving a control signal, a bulk terminal connected to said second reference line and first and second terminals connected, respectively, to said first and second terminals of said ninth transistor.

14. The row decoder according to claim 13 wherein said tenth transistor has a triple-well type structure.

15. The row decoder according to claim 1 wherein said output biasing signal of said respective word line supplies a potential equal to said first reference potential when said word line is selected during the read phase.

16. The row decoder according to claim 1 wherein said output biasing signal of said respective word line supplies a potential equal to said second reference potential when said word line is deselected during the read phase.

17. The row decoder according to claim 1 wherein said output biasing signal of said respective word line supplies a potential equal to said programming potential when said word line is selected during the programming phase.

18. The row decoder according to claim 1 wherein said output biasing signal of said respective word line supplies a potential equal to said second reference potential when said word line is deselected during the programming phase.

19. The row decoder according to claim 1 wherein said output biasing signal of said respective word line supplies a potential equal to said erase potential when said word line is deselected during the erase phase.

20. The row decoder according to claim 1 wherein said second reference line, set at said second operating potential, is switchable at least between a second reference potential lower than said first reference potential, a verify potential lower than said second reference potential and an erase potential lower than said verify potential.

21. The row decoder according to claim 20 wherein said output biasing signal of said respective word line supplies a potential equal to said first reference potential when said word line is selected during the verify phase.

22. The row decoder according to claim 20 wherein said output biasing signal of said respective word line supplies a potential equal to said verify potential when said word line is deselected during the verify phase.

23. A circuit comprising:
a word line coupled to a plurality of memory cells;
a driver circuit having an input terminal, a high reference potential terminal, a low reference potential terminal and an output terminal coupled to said word line;
said low reference potential terminal structured to provide a low voltage on said word line when a potential on the input terminal is in a first state;
said high reference potential terminal structured to provide a high voltage on said word line when the potential on the input terminal is in a second state; and a level translator circuit having an output coupled to the input terminal of the driver circuit, the level translator circuit having an input coupled to a row selection circuit.

24. The circuit according to claim 23 wherein said low voltage is selectable between a first voltage level, a second voltage level and a third voltage level; the second voltage level being lower than the first and the third voltage level being lower than the second.

25. The circuit according to claim 23 wherein said high voltage is selectable between a first voltage level and a second voltage level, the second voltage level being higher than the first.

26. The circuit of claim 23 wherein the level translator circuit comprises:

an inverter having an input coupled to the row selection circuit and an output; and a first transistor having a control terminal coupled to the output of the inverter, a first terminal coupled to the input terminal of the driver circuit, and a second terminal coupled to the low reference potential terminal of the driver circuit.

* * * * *